United States Patent
Roine

(10) Patent No.: US 8,495,438 B2
(45) Date of Patent: Jul. 23, 2013

(54) TECHNIQUE FOR MEMORY IMPRINT RELIABILITY IMPROVEMENT

(75) Inventor: Per Torstein Roine, Oslo (NO)

(73) Assignee: Texas Instruments Incorporated, Dallas, TX (US)

(*) Notice: Subject to any disclaimer, the term of this patent is extended or adjusted under 35 U.S.C. 154(b) by 865 days.

(21) Appl. No.: 12/205,976

(22) Filed: Sep. 8, 2008

(65) Prior Publication Data

US 2009/0172496 A1    Jul. 2, 2009

Related U.S. Application Data

(60) Provisional application No. 61/017,381, filed on Dec. 28, 2007.

(51) Int. Cl.
*G11C 29/00* (2006.01)
(52) U.S. Cl.
USPC .................................................. 714/719
(58) Field of Classification Search
USPC ................ 714/719, 701; 711/106; 365/222
See application file for complete search history.

(56) References Cited

U.S. PATENT DOCUMENTS

| | | | | |
|---|---|---|---|---|
| 5,270,967 A * | 12/1993 | Moazzami et al. | ........... | 365/145 |
| 6,091,625 A * | 7/2000 | Braun et al. | ................... | 365/145 |
| 6,246,603 B1 * | 6/2001 | Brady | ........................... | 365/145 |
| 6,922,350 B2 * | 7/2005 | Coulson et al. | ............... | 365/121 |
| 8,015,344 B2 * | 9/2011 | Kim et al. | ...................... | 711/103 |
| 2001/0043499 A1 * | 11/2001 | Komura et al. | ............... | 365/222 |
| 2004/0062070 A1 * | 4/2004 | Coulson et al. | ............... | 365/145 |
| 2006/0112215 A1 * | 5/2006 | Kim et al. | ...................... | 711/103 |
| 2007/0079210 A1 * | 4/2007 | Bell et al. | ....................... | 714/758 |
| 2008/0096631 A1 * | 4/2008 | Gagner | ........................... | 463/20 |

* cited by examiner

*Primary Examiner* — Joshua Lohn
(74) *Attorney, Agent, or Firm* — Rose Alyssa Keagy; Wade J. Brady, III; Frederick J. Telecky, Jr.

(57) ABSTRACT

One embodiment of the present invention relates to a method of reducing imprint of a memory cell. The method comprises adding an inversion condition bit operably associated with one or more memory cells storing a memory word. The inversion condition bit indicates whether the memory word represents an actual payload or an inversion of the actual payload. The inversion condition bit and memory word are selectively toggled by a control circuitry. Inversion is performed by reading the inversion condition bit and memory word and rewriting the memory word back to the one or more memory cells in an inverted or non-inverted state, depending on an inversion condition bit. The inversion condition bit is then written to the inversion status bit value. The memory address is incremented, and the inversion status data state is toggled once the address counter addresses the entire memory array. Other methods and circuits are also disclosed.

9 Claims, 13 Drawing Sheets

TECHNIQUE FOR MEMORY IMPRINT RELIABILITY IMPROVEMENT

RELATED APPLICATION

This application claims priority to Ser. No. 61/017,381 filed Dec. 28, 2007, which is entitled "Technique for Memory Imprint Reliability Improvement".

FIELD OF INVENTION

The present invention relates generally to semiconductor devices and more particularly to reduction of imprint for memory arrays with low impact on memory system availability.

BACKGROUND OF THE INVENTION

In recent years the market of the semiconductor industry has grown considerably for supplying integrated chips to companies which manufacture portable electronic devices. The integrated chips used to make these portable electronic devices, such as cell phones, PDAs, laptop computers and the like, are mostly made in emerging technology nodes. This is because emerging technology nodes offer higher density chips with greater performance and lower power consumption. These qualities are important to portable electronic devices which are continually striving to offer greater functionality while relying on relatively small energy sources (e.g., batteries). The demand for these products has driven the industry to devote many resources to developing low power integrated chips, often resulting in specific processes.

Memory is an important aspect of power consumption. Therefore, attempts to meet industry needs have also resulted in the emergence of new memory types and changes in existing memory types. For example, ferroelectric random access memory (FRAM), magnetoresistance random access memory (MRAM) and phase change memory (PRAM) are just a few of the many new memory types that are being increasingly researched as an alternative to present day industry standards. While each of these new technologies brings new advantages, they also bring new challenges. In particular, they require reliability to address new problems based upon non-traditional parameters.

Imprint is a reliability concern that has been observed in new memory types such as FRAM. Imprint is the tendency of a memory cell which remains in the same data state over a long period of time to retain a remnant of that data state upon being driven to another data state. For example, in FRAM memory imprint is the tendency of a ferroelectric capacitor which stays in the same polarization state over a long period of time to retain a remnant polarization upon being driven to another polarization state. Over time, imprint will create a growing offset voltage which eventually will make distinction between data states (e.g., "0" or "1") impossible.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

One embodiment of the present invention relates to a method for reducing imprint of a memory cell. The method comprises adding an additional bit in a first memory location on each word of a memory array. The additional bit, an inversion condition bit, is operably associated with the memory bit(s) of the word and is indicative of whether the memory data states of the word represent actual payload bits or an inversion of the payload bits. The inversion condition bit and the associated memory bit(s) are selectively toggled (e.g., "0" to "1" or "1" to "0") by a control circuitry which comprises a memory address and an inversion status bit stored in a second memory location. The inversion process is performed by first reading the inversion condition bit and the memory bit(s) found at the memory address. The memory bit is then rewritten back to the memory location inverted or non-inverted, depending on the state of an invert status flag. The inversion condition bit is written to the inversion status bit value. The memory address is then incremented, and the inversion status data state is toggled upon the address counter wrapping around the memory. Additional embodiments of memory arrays and methods of inversion are also disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
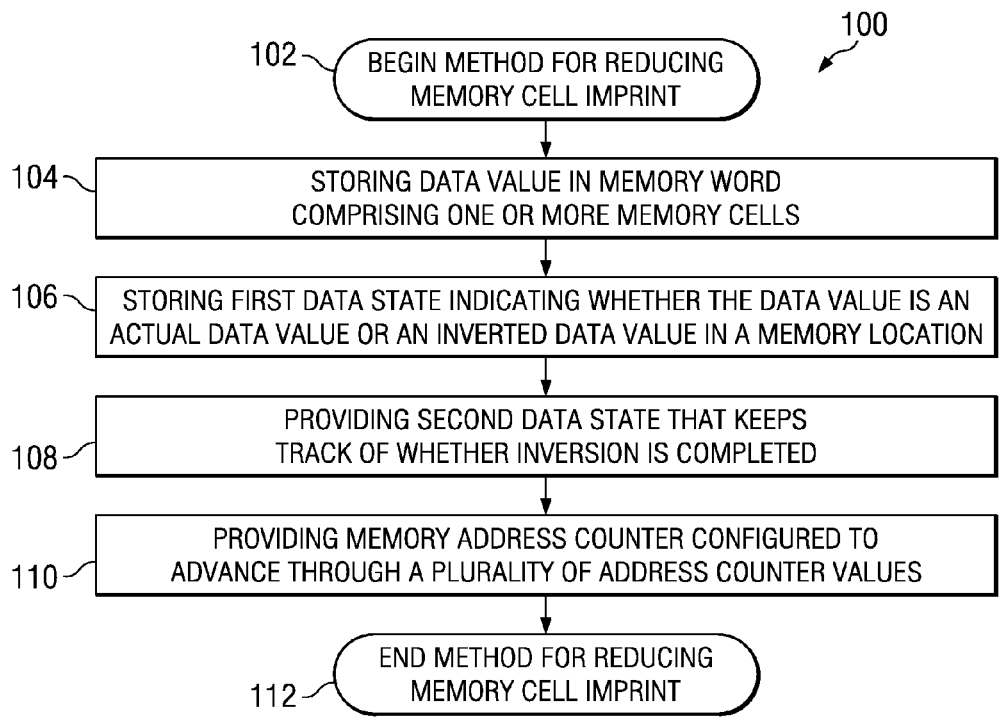
FIG. 1 shows a flow chart a method for reducing imprint of a memory array.

The present invention will now be described with reference to the attached drawing figures, wherein like reference numerals are used to refer to like elements throughout, and wherein the illustrated structures and devices are not necessarily drawn to scale.

Also, it will be appreciated that the method and memory devices disclosed may be applied to a wide variety of memory devices. For example, memory devices may include memory cells having ferroelectric capacitive elements or other elements that may be affected by imprint or memory devices that may be impacted by signal margin.

As provided herein the present invention relates a method and system for improving the reliability of electronic memory by for reducing imprint of memory cells. More particularly, a bit (e.g., an inversion condition bit, an inversion status bit) is associated with a data value (i.e., a value of the "user data" read from, or to be written to, a memory word or location) comprised within a memory word (i.e., a unit of memory that can be read/written together and contains only user data). The data bit can be toggled to change the value of data (i.e., the value of the "user data" read from, or to be written to, a memory word or location). In one embodiment, the data bit and associated memory word form a memory location (i.e., a unit of memory that can be read/written together and contains inversion condition bit(s) and in some cases an ECC syndrome in addition to user data), for example.

FIG. 1 shows a method 100 for reducing imprint of a memory cell in conjunction with the disclosed invention. While the methods (100, 200, 220, 240, 400, 426, 450, 600, 700, 800, and 900) of this disclosure are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

The process flow 100 of FIG. 1 describes a method for reducing imprint of a memory array. The method comprises utilizing a first and a second data bit which are selectively configured to allow a memory word to change data value so over time (e.g., from "0" to "1" or "1" to "0") but continue to output the same data (i.e., data stored in a computer can be toggled to reduce imprint without changing the output data value).

At 104 a data value is stored in a memory word (i.e., a collection of memory bit cells that can be read or written together in one atomic memory operation and which contains only user data) comprising one or more memory cells. The memory word will comprise one or more data states (e.g., "0" or "1") written to respective memory cells.

At 106 a first data state is stored in a memory location (i.e., a unit of memory that can be read or written together and contains inversion condition bit(s) and in some cases an ECC syndrome bit) operably associated with the memory word. The first data state (e.g., a high data state, "1", or a low data state, "0") indicates if the data value is an actual data value or an inverted data value. For example, in one embodiment, if a first data state comprises a "0", a memory word comprising a "1" will be not be inverted upon being read from the memory array and a payload of "1" will be output. In contrast, if a first data state comprises a "1", a memory word comprising a "1" will be inverted upon being read from the memory array and a payload of "0" will be output.

At 108 a second data state is provided. The second data state comprises information which keeps track of whether or not an inversion is completed. The second data state is used to regulate the operation of the first data state. Cumulatively, the first and second data states of FIG. 1 provide a system by which a memory word can be toggled without losing data stored within it.

At 110 a memory address counter is provided. The memory address counter is configured to advance through a plurality of memory addresses comprising a memory array. For example, each memory word stored in a memory array is associated with a particular memory address. The memory address counter will incrementally advance through the memory addresses of a memory array. At each memory address the used in conjunction with the first and second data states will be used to invert the data stored in a memory word. The memory address counter will then advance to a next memory address.

Inversion according to the method of FIG. 1 can be performed according to two main methods that will be described in this disclosure. The first method is an "inversion condition bit method", by which (e.g., described in FIGS. 2A-2C). The second method is an "inversion counter method", by which (e.g., described in FIGS. 3A-4C). Additionally both methods (e.g., the inversion condition bit and the inversion counter methods) can be implemented in conjunction with an error correction code (ECC) resulting in a robust method of ECC (e.g., described in FIGS. 6A-9). The methods described in FIG. 2A through FIG. 9 are only possible non-limiting embodiments of the method of FIG. 1. It will be appreciated that other alternative embodiments have been contemplated by the inventor.

In an inversion condition bit method embodiment the first data state is an inversion condition bit and the second data state is an inversion status bit indicating the status of memory inversion for the memory array (i.e., indicating whether the entire memory array has been inverted). In an inversion counter method the first data state is an inversion status bit (e.g., indicating whether data of a memory word has been inverted) and the second data state is an inversion pending bit indicating if an inversion of data in an associated memory word is currently taking place.

Furthermore, it will be appreciated that the memory inversion performed in the following figures can be divided into short sequences of operations that in many cases can utilize idle memory cycles with minimum disturbance of the normal system operation. Therefore, each figure contains the acts which comprise such a sequence. The initial act indicates that conditions are right to start another iteration. For example, a memory system could consist of two timers, one with a short period (to ensure that memory inversion consumes an insignificant amount of resources) and another with a longer period (to ensure memory inversion occurs at a minimum rate). If the short period timer expires, the algorithm may grab the next idle memory cycle to perform memory inversion. If the long period timer expires, the algorithm will grab next memory cycle to perform memory inversion, causing a wait state for other uses of the memory. Alternatively, the long period timeout may cause a software interrupt and have software assistance in advancing the algorithm state. Each time the condition has been met for inversion (i.e. the algorithm advances by one address), the timers may be reset (more sophisticated timeout control can also be applied).

Figure 2C:
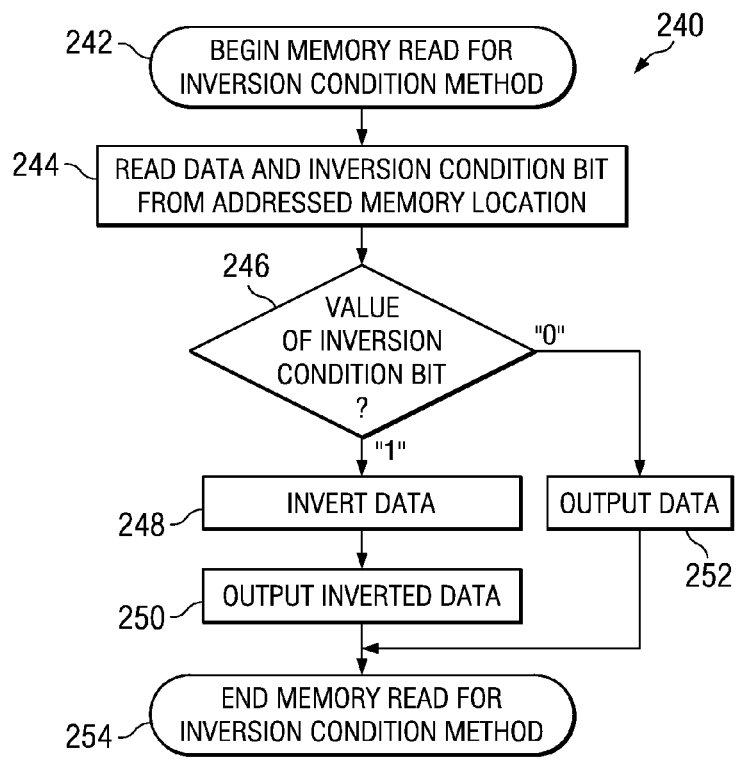
FIG. 2C shows a flow chart for reading a memory word from a memory array using the inversion condition bit method.
Figure 2A:
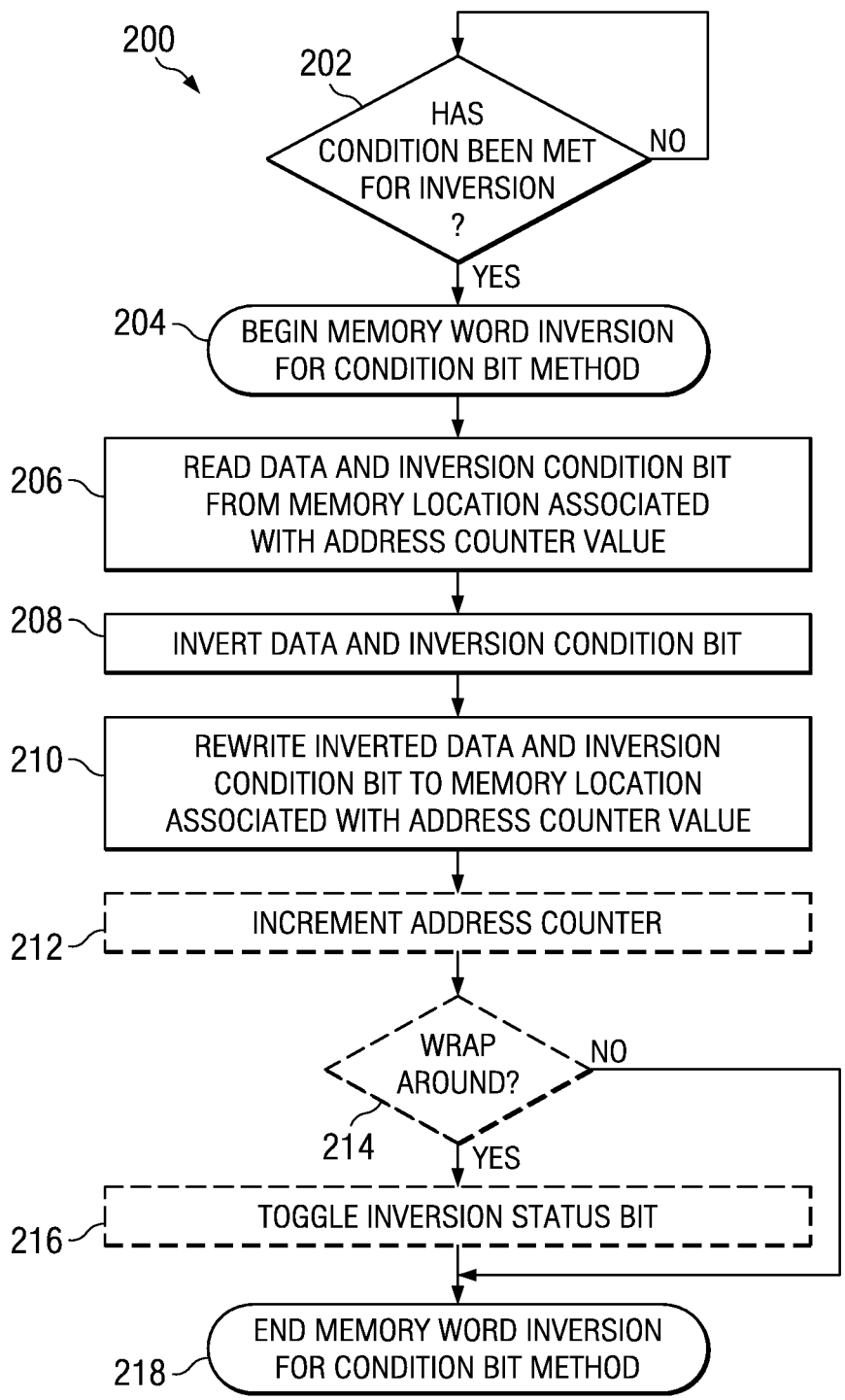
FIG. 2A shows a flow chart for the inversion condition bit method of selectively inverting a memory word.
Figure 2B:
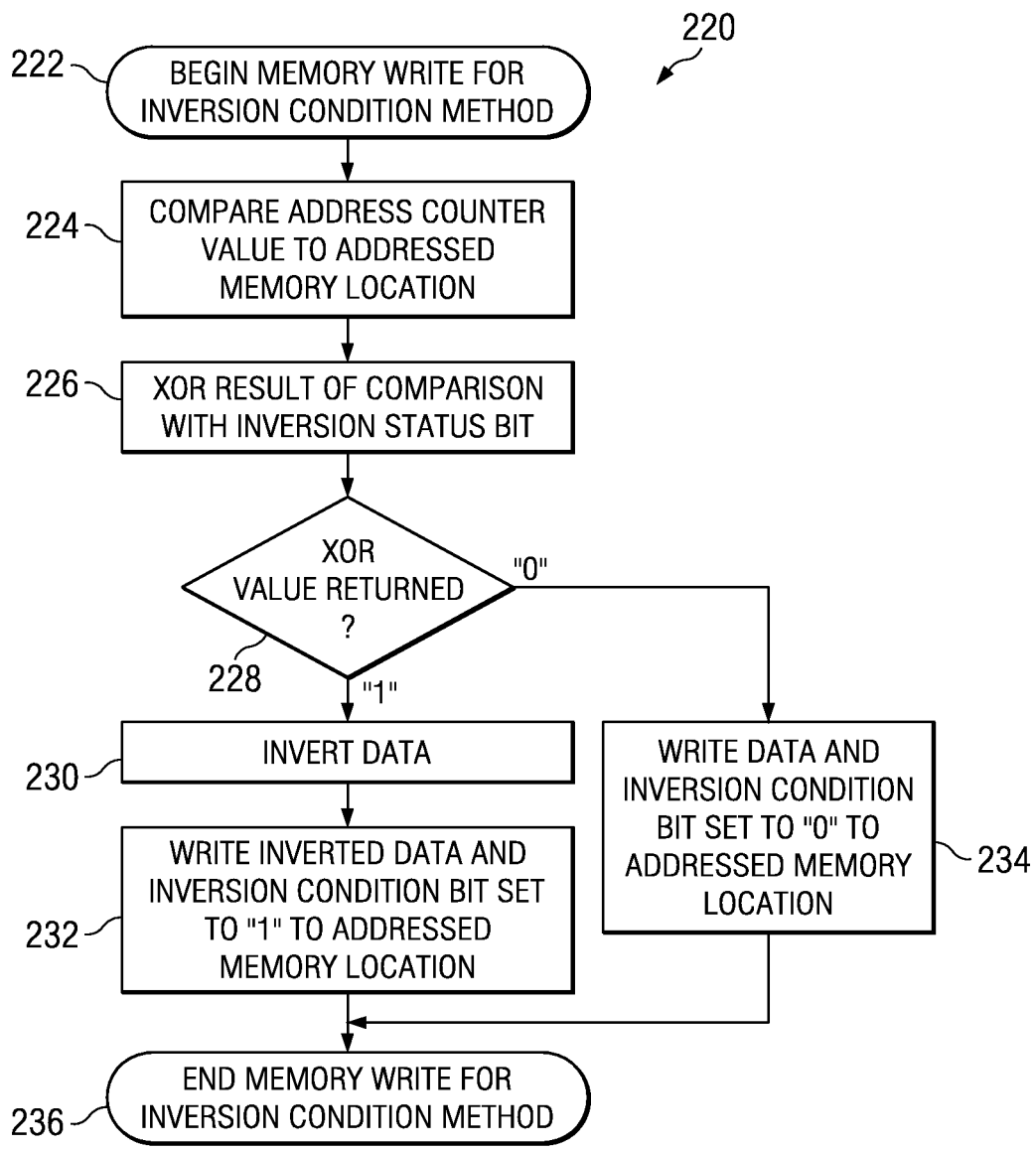
FIG. 2B shows a flow chart for writing data to one or more memory cells using the inversion condition bit method.

FIGS. 2A-2C show one embodiment of the present invention relating to an "inversion condition bit method". In the inversion condition bit method the first data state comprises an inversion condition bit and the second data state comprises an inversion status bit.

FIG. 2A illustrates a method for memory word inversion using the inversion condition bit method by which a memory array is selectively (e.g., periodically) inverted to reduce imprint without disrupting memory availability. The memory word and associated inversion condition bit(s) are selectively toggled (e.g., "0" changed to "1" or "1" changed to "0") depending on a condition being met for inversion. The implementation of the process flow 200 will disable memory access for two memory cycles each time a memory location is inverted.

Upon power up, an algorithm state corresponding to an algorithm controlling the inversion of memory cells is recreated (e.g., by binary search) comprising an inversion status bit and an M-bit address counter, where M is equal to the number of address bits in the memory array. The inversion status bit is toggled when the address counter wraps around (i.e., equal to M+1 bits of count).

At 202 the system is asked if the condition has been met for inversion. If the condition for inversion has been met, the memory word inversion begins at 204. If the condition for inversion has not been met the query is repeated until the condition for inversion is met. In one embodiment, the M-bit address counter is configured to determine whether the condition for inversion has been met by advancing through a plurality of address counter values (e.g., memory addresses comprising the memory array) and identifying inversion condition bit(s) of a given memory word address that indicate inversion is required (e.g., inversion condition bits storing a "1").

At 206, data (a data value) and an inversion condition bit are read from a memory location associated with the address counter.

At 208 the data and inversion condition bit are inverted. Concurrently inverting the inversion condition bit and the data ensures that a payload output through a logic gate or simple circuitry remain the same. For example, by changing both the value of the data and the associated inversion condition bit an output payload sent through an XOR logic gate will remain the same (i.e., the output value of the memory cells remains the same).

The inverted data and the inverted inversion condition bit are rewritten back to the memory location associated with the address counter's current value at 210.

The address of the address counter is optionally incremented at 212. The address counter is incremented in situations where the user wants to perform an inversion on multiple memory locations of the memory array. For example, a memory location is inverted according to acts 204-210, the address counter is incremented by increasing the address counter value at 212, and then a new (incremented) memory location is inverted according to acts 204-210. In one particular embodiment, shown in FIG. 2A, the address counter can be configured to increment the address counter value such that the entire memory array is inverted.

At 214 the address counter is optionally wrapped around. The address counter is wrapped around (i.e., the address counter will wrap around from the address counter value of the most significant bit to the address counter value of the lease significant bit) for situations where a user wants to invert a memory array multiple times. Once all memory locations of a memory array have been inverted the address counter value will be wrapped around. Therefore, the address counter will continue to increment the address counter value until acts 204 through 210 have been implemented on each memory location of the memory array.

Once all of the memory locations of a memory array have been inverted and the address counter has wrapped around the inversion status bit will be toggled at 216 (i.e., the inversion status bit acts as bit MSB (most significant bit)+1). Toggling the inversion status bit keeps track of the inversion for subsequent memory array inversions.

It will be appreciated that acts 212 and 218 can be skipped according to the user needs. If acts 212-218 are skipped the method of FIG. 2 continues on to completion of the memory word inversion for a condition bit method at 220.

In an alternative embodiment, the inversion condition bit may be selectively toggled according to the inversion status bit stored in the second memory location. In such an embodiment, the inversion condition bit would be read and compared to the inversion status bit. If the inversion status bit is equal to the inversion condition bit there would be no inversion. If the inversion status bit is not equal to the inversion condition bit both the inversion condition bit and the memory word would be inverted. The inversion status bit would be toggled upon the address counter cycling through all of the memory array addresses and the cycle would repeat.

FIG. 2B refers to a method 220 for writing data to a memory array utilizing the inversion condition bit method.

At 224 the address counter value of the address counter is compared to an addressed memory location. In one embodiment, the comparison is done using a comparator circuitry. For example, a comparator circuitry could output a high value if the addressed memory location is less than the address counter value and a low value if the addressed memory location is greater than or equal to the address counter value.

The output of the comparison function along with the inversion status bit is feed into a logic gate at 226. For example, as shown in FIG. 2B, the output of the XOR logic gate will be "0" if the inversion status bit is set (e.g., high) and "1" if the inversion status bit is not set (e.g., low).

If the output signal of the XOR logic gate is a high signal (i.e., "1"), the data to be written is inverted at 230 to ensure a proper payload (i.e., output of the bit stored in the memory array). At 232 the inverted data and an inversion condition bit having a high data state value (i.e., "1") are rewritten to the appropriate addressed memory location associated with the address counter value. The memory write operation then ends at 236.

If the output signal of the XOR logic gate is a low signal (i.e., "0"), the data to be written is not inverted. Therefore, at 234 the non-inverted data and an inversion condition bit set equal to "0" are written directly to the addressed memory location. The memory write operation then ends at 236. In the structures and methods of this invention the XOR logic gate is used as an example of a logic function that may be used to implement the disclosed invention. In alternative embodiments, other logic functions or simple circuitry may be used in place of the XOR gate. For example, an XNOR gate can be used in place of the XOR logic gate of step 226, resulting in a high output if the inversion status bit is set and a low output if the inversion status bit is not set. For all embodiments the inventors have contemplated the use of various logic gates or simple circuitry which could be used in place of the referenced XOR logic gate.

FIG. 2C illustrates a method 240 for reading a memory word from a memory array utilizing the inversion condition bit method.

At 244 the data and the inversion condition bit are read from an addressed memory location (i.e., addressed by the address counter).

An XOR logic function (i.e., logic function) will act upon the data and the inversion condition bit at 246. If an XOR logic gate is used an inversion condition bit having a high data state (e.g., "1" option) will invert the data at 248, resulting in inverted data to be output at 250. Alternatively, an inversion condition bit having a low data state (e.g., "0" option) will cause an XOR logic gate not invert the data resulting in non-inverted data to be output at 252 with a value equal to the value read at 244.

FIGS. 3A-4C illustrate an alternative embodiment of the present invention, an "inversion counter method". In the inversion counter method the first data state is an inversion status bit and the second data state is an inversion pending bit. The inversion status bit will specify whether or not a memory word payload is an actual payload or an inverted payload and inversion pending bit is added to ensure safe disruption of the memory array. Practically, the memory required for the inversion counter method embodiment will be less than the inversion condition bit embodiment.

Figure 3A:
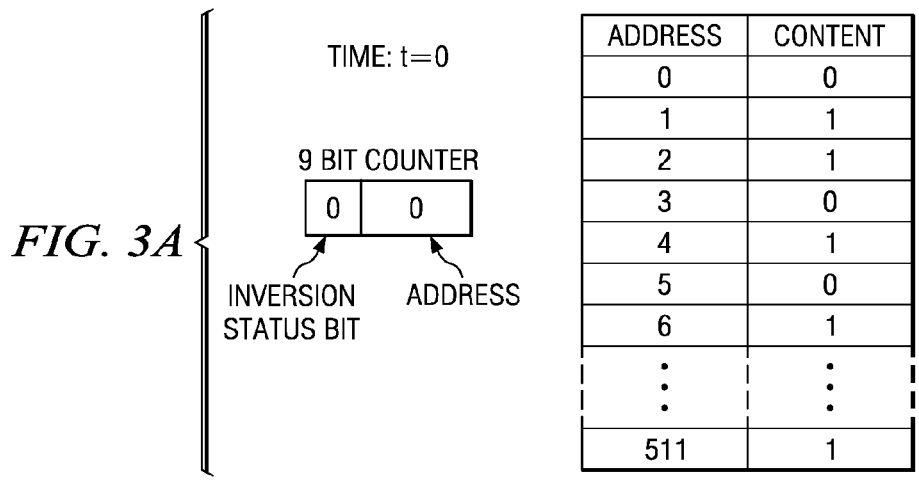
FIG. 3A shows a flow chart for the inversion counter method of selectively inverting a memory word.
Figure 3B:
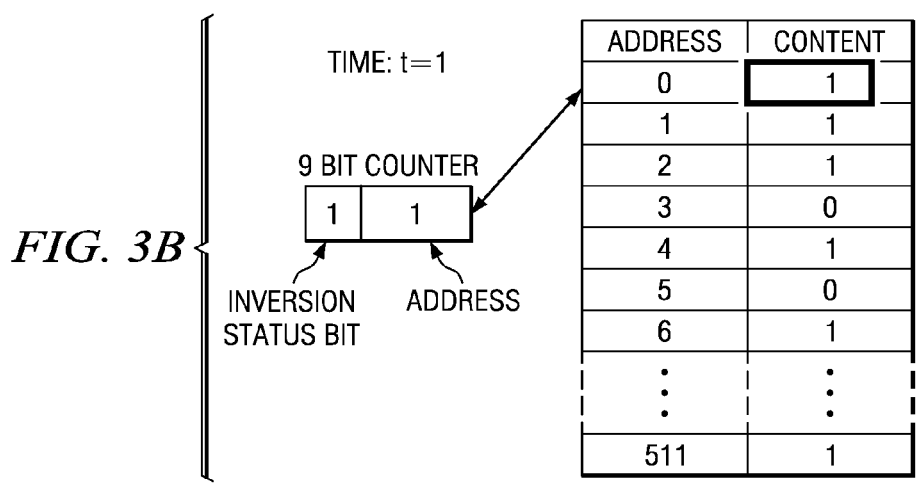
FIG. 3B shows a flow chart for writing data to one or more memory cells using the inversion counter method.
Figure 3C:
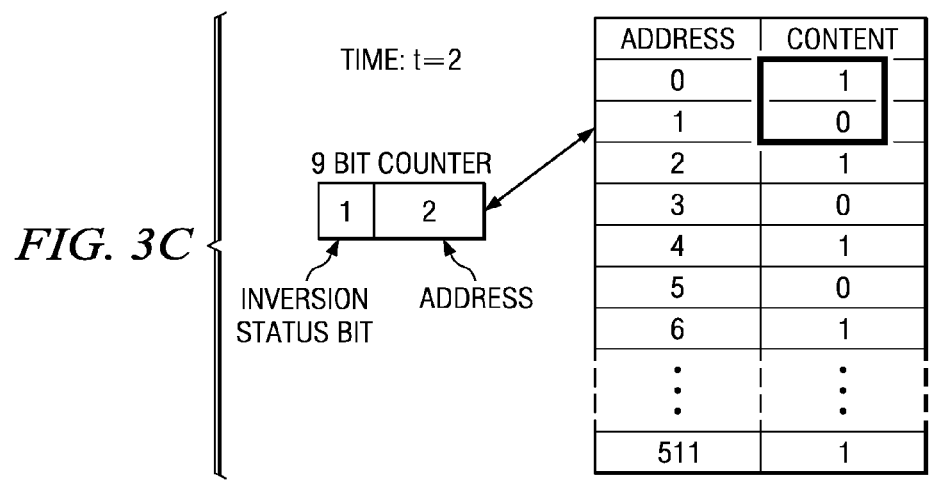
FIG. 3C shows a flow chart for reading a memory word from a memory array using the inversion counter method.

FIGS. 3A-3C show one embodiment of the inversion counter method, wherein the address counter will apply the inversion status bit to the memory words at or above its address counter value. For example, in FIG. 3A the memory cell is at an initial state of time t=0. At time t=1, shown in FIG. 3B, the address counter points to address 0. Therefore, all memory cells at or above address 0 have their memory bits inverted at time t=1. FIG. 3C, shows time t=2. At time t=2, the address counter points to address 1 and all memory cells at or above address 1 have their memory bits inverted. In this way an entire memory array may be inverted as time (t) progresses. Additional embodiments comprising variations on the algorithm of FIGS. 3A-3C may also be used such as inverting cells with addresses greater then the address. The inventors have contemplated a large number of alternative methods in which the address counter could be used to invert the memory locations of a memory array.

Figure 4A:
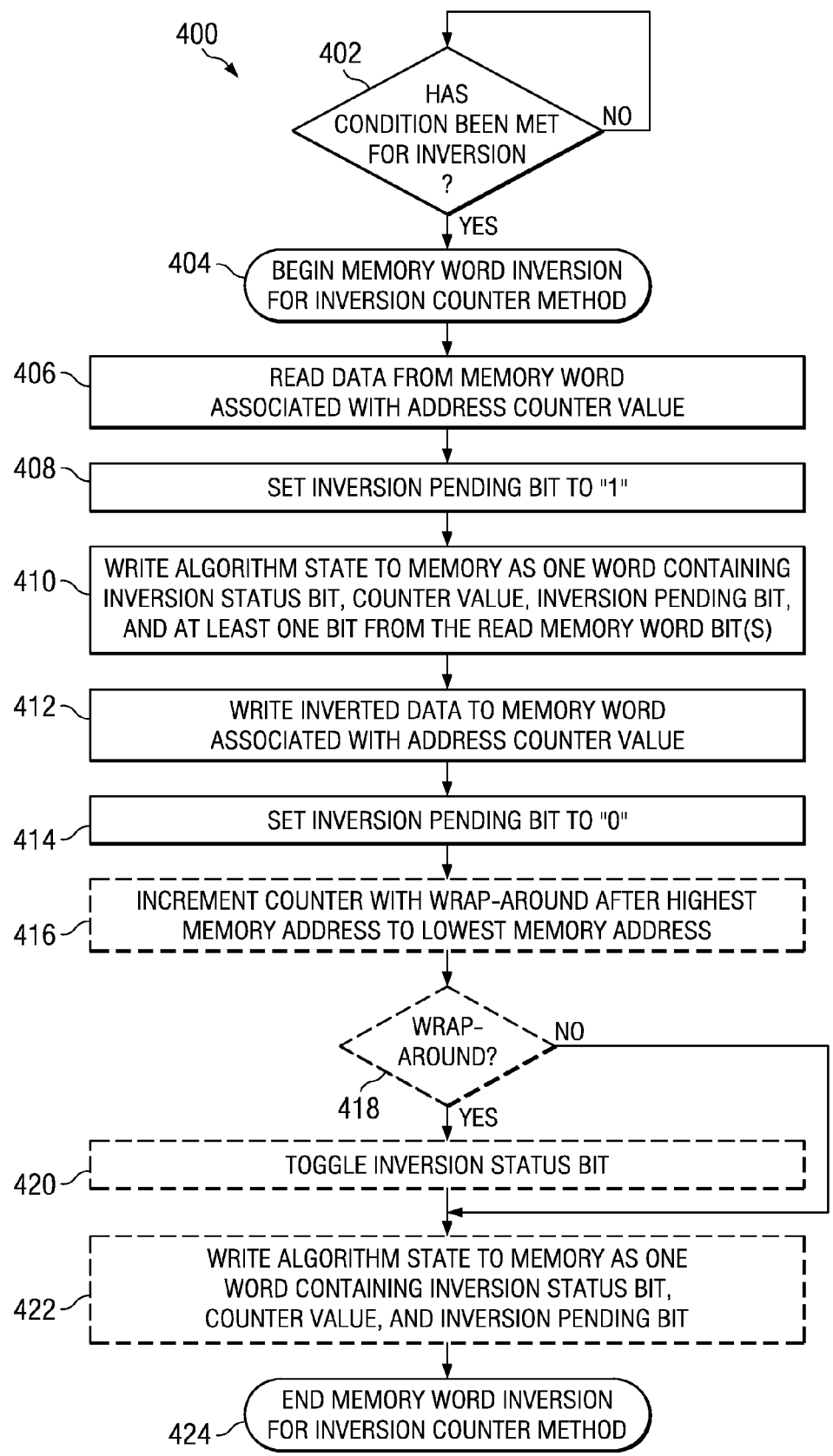
FIG. 4A shows a flow chart for the inversion counter method of selectively inverting the memory word.

FIG. 4A illustrates a method 400 for memory word inversion using the inversion counter method.

Upon power up an algorithm state corresponding to an algorithm controlling the inversion of memory cells is recreated comprising an address counter value, an inversion status bit, an inversion pending bit, and a bit from the memory location to be inverted next. This implementation will disable memory access for four memory cycles each time a memory location is inverted.

Method 400 begins by querying whether the condition for inversion has been met at 402. If the condition for inversion has been met, then the inversion process begins at 404.

At 406 data (a data value) from a memory word is read from a memory word associated with an address counter value.

At 408 the inversion pending bit is set to a data state indicating that inversion is in progress (e.g., "1"). A comparison of a combination of the inversion pending bit and the memory bit stored in the algorithm state to the memory bit of the memory location is indicative of whether or not memory inversion has occurred yet. For example, consider an inversion pending bit of "1", a memory bit stored in the algorithm state of "1", and a memory bit stored in the memory location of "1". A combination of the inversion pending bit and the memory bit stored in the algorithm through a XOR logic gate would yield a "0", which being different then the memory bit of the memory location indicates that inversion has not occurred yet.

The algorithm state, with inversion pending bit set, is written to a fourth additional memory location as one word at 410. The algorithm state includes the inversion status bit, the address counter value, the inversion pending bit and at least one bit from the data.

The data is inverted and the inverted data is rewritten into the memory word associated with address counter value at 412.

At 414 the inversion pending bit is set to a data state indicating that the inversion for the associated memory address has been completed (e.g., "0").

At 416 the address counter is optionally incremented to another address counter value. If all of the memory cells have not been inverted, the flow then proceeds again from 406 through 416.

Once all of the memory words have been addressed, the address counter optionally wraps around 418 (e.g., returns to the first addressed memory word location) and the inversion status bit is optionally toggled at 420. The process can subsequently repeat, proceeding through the plurality of memory addresses with a different inversion status bit so that the memory data bits are further toggled to reduce imprint.

Finally, the algorithm state, comprising the inversion status bit, the address counter value, and the inversion pending bit, is written again to the fourth additional memory location as one word at 422.

Figure 4B:
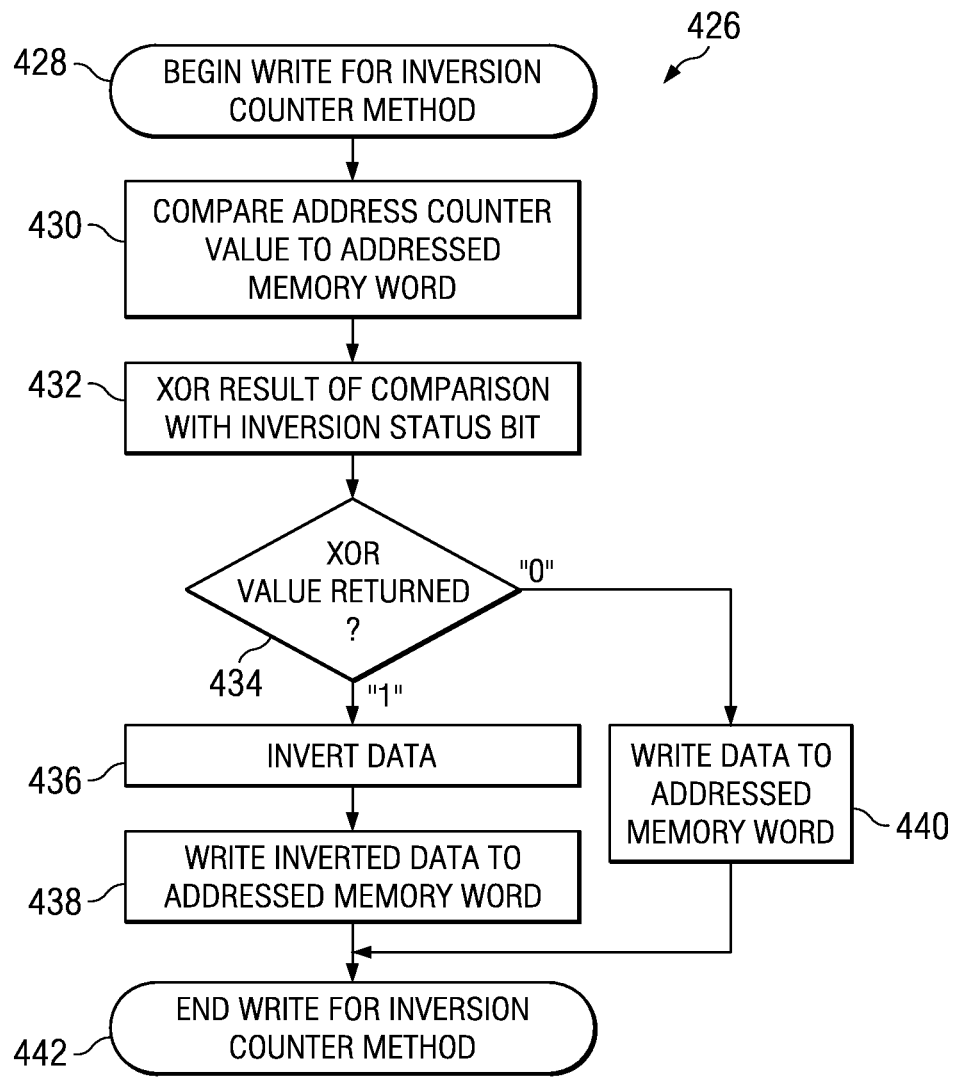
FIG. 4B shows a flow chart for writing data to one or more memory cells using the inversion counter method.

FIG. 4B illustrates a method 426 for writing to a memory array using the inversion counter method.

At 430 the address counter value is compared to the address associated with the memory word/location being written to. The comparison can be done using a comparator circuit. For example, a comparator could output a high value if the address of the memory cell being written to is less than the address of the address counter and a low value if the address of the memory cell being written to is greater than or equal to the address of the address counter.

The output of the comparison function and the inversion status bit will be feed into a logic gate at 432. For example, the output of an XOR logic gate will be "0" if the inversion stats flag is set (e.g., high) and "1" if the inversion status flag is not set (e.g., low). The XOR logic gate is intended as an example and could be replaced by other logic functions or other simpler circuitry.

If the result of the XOR logic gate is a high signal (i.e., "1"), the data to be written is inverted at 436. The inverted data is then written to the addressed memory word at 438 and the write operation is concluded at 442.

If the result of the XOR logic gate is a low signal (i.e., "0"), the data to be written is not inverted. The non-inverted data is written directly to the addressed memory word at 440 and the write operation is concluded at 442.

Figure 4C:
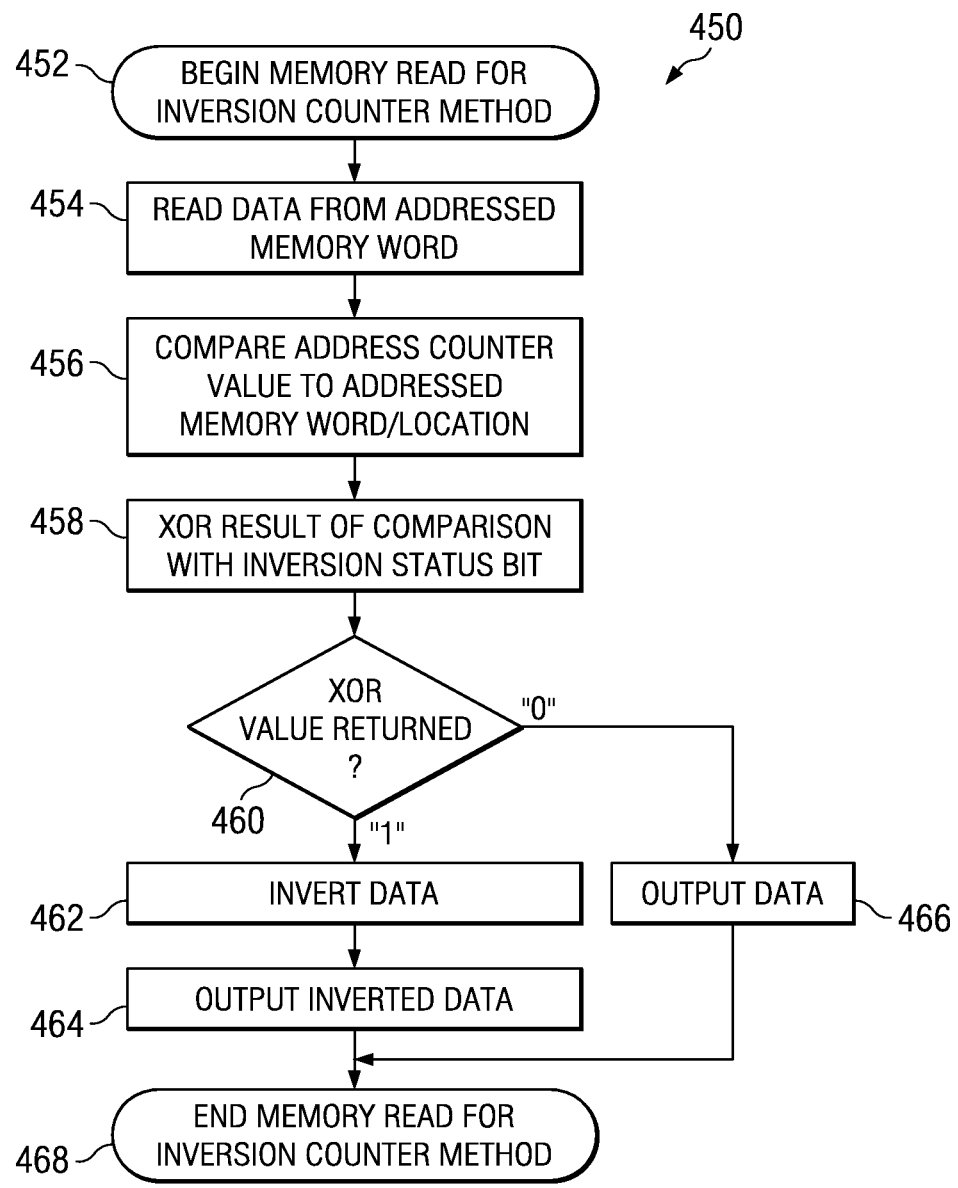
FIG. 4C shows a flow chart for reading a memory word from a memory array using the inversion counter method.

FIG. 4C shows a method for reading a memory data state from a memory array using the inversion counter method.

At 454 the data is read from an addressed memory word/location.

The address counter value is compared to the addressed memory word/location at 456. The comparison result in either a high or low data state. For example, if the addresses are the same the comparison will yield a high data state. If the address are not the same the comparison will yield a low data state.

The results of the comparison and the inversion status bit are input into a logic function at 458. The logic function may be an XOR function, as shown, for example in FIG. 4C. The comparison between the address counter address and the memory word address drives the results of the logic function and inverts the data state read when necessary.

If the logic function is an XOR logic gate, a high comparison value will cause the data read at 454 to be inverted at 462. The inverted data is then output at 464 and the read operation is concluded at 464.

If the logic function of the XOR logic gate is low, at 466 the XOR logic gate will output data having the same value it had when it was read in 454. The read operation is concluded at 464.

Figure 5A:
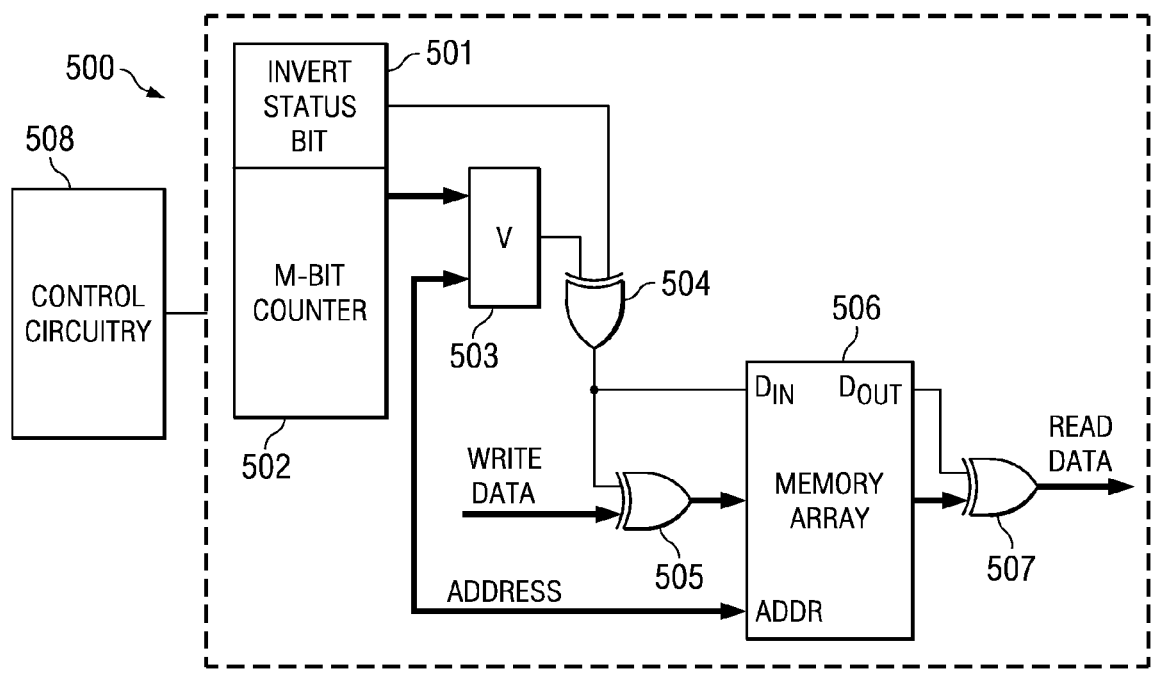
FIG. 5A shows block diagrams of the inversion condition bit method with arrows denoting data flow.
Figure 5B:
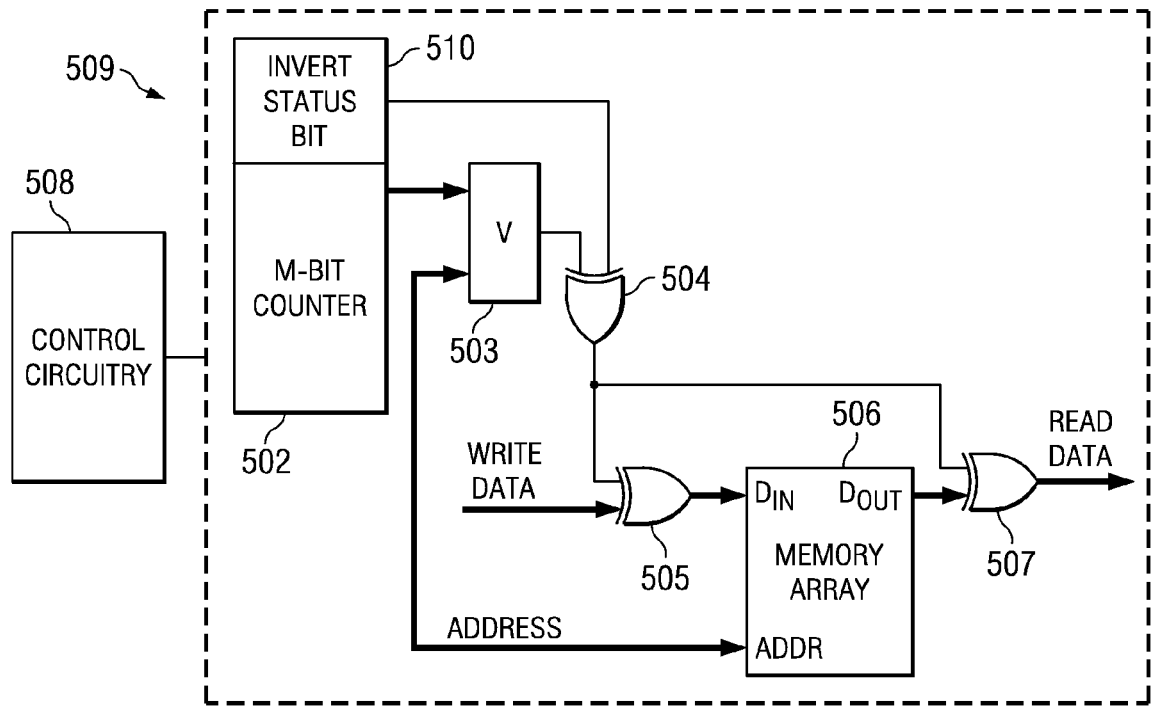
FIG. 5B shows block diagrams of the inversion counter method with arrows denoting data flow.

FIGS. 5A and 5B are block diagrams of exemplary implementations of a reduced imprint memory array described in the above two embodiments. FIG. 5A shows the data flow of a write and read process using the inversion condition bit method. FIG. 5B shows the data flow of a write and read process using the inversion counter method.

Referring now to FIG. 5A, a memory array 506 stores at least one memory word and a corresponding inversion condition bit (located within a first memory location within the memory array). A comparator 503 compares an address provided by an M-bit address counter 502 to the address of the memory word. A first logic circuitry 504 (e.g., XOR logic gate) receives the output of the comparator 503 and an inversion status bit stored in a second memory location 501. The output of the first logic circuitry 504 is sent to the second logic circuitry 505 and the memory array 506. The output of the first logic circuitry writes a value to the inversion condition bit stored in the memory array 506. The second logic circuitry 505 (e.g., XOR logic gate) receives the output of the first logic circuitry 504 along with data to be written to the memory array 406. The second logic circuitry 505 determines whether or not the data to be written is written in an inverted or non-inverted state. The read flow uses a third logic circuitry 507 (e.g., XOR logic gate) through which the output of the memory array 506 is sent. The entire process is controlled by way of a control circuitry 508.

Referring to FIG. 5B, the memory array 506 stores at least one memory word. A comparator 503 compares an address provided by an M-bit address counter 502 to the address of the memory word. A first logic circuitry 504 (e.g., XOR logic gate) receives the output of the comparator 503 and an inversion status bit stored in a first memory location 510. The second logic circuitry 505 (e.g., XOR logic gate) receives the output of the first logic circuitry 504 along with data to be written to the memory array 506. The second logic circuitry 505 determines whether or not the data to be written is written in an inverted or non-inverted state. The read flow uses a third logic circuitry 507 (e.g., XOR logic gate) that receives the output of the first logic circuitry 504 and the output of the memory array 506. The entire process is controlled by way of a control circuitry 508. The XOR logic gate shown in FIGS. 5A and 5B can be replaced by other logic structures or other simpler circuitry (e.g., NAND gates, inverters, etc.).

FIGS. 6A-8 illustrate an additional embodiment of the enclosed invention in which error correction code (ECC) is utilizing in conjunction with the inversion condition bit method. In relation to memory, ECC is used as a method by which errors in stored memory words can be recognized and at times even fixed.

Single error correction, double error detection (SECDED) codes are one type of ECC. SECDED ECC has the ability to correct single data bit errors which occur in memory arrays. It can also detect, but not fix, double data bit errors. SECDED ECC requires additional bits to be placed throughout the memory arrays. These additional bits, stored in a first additional memory location, are ECC syndrome bits and a parity bit and are used to identify and locate errors within the memory array. A parity bit comes in two types, odd and even.

Odd parity bits are set equal to 1 if the number of 1's (including the parity bit) in a given set is odd. An even parity bit is set equal to 0 if the number of 1's (including the parity bit) in a given set is even. ECC syndrome bits are the XOR of computed check bits and read check bits. Non-zero ECC syndrome bits denote an error in the memory.

Either one or two inversion condition bits will be added to each ECC protected memory word depending on the number of ECC syndrome bits of the memory word. A single inversion condition bit is added to memory words that have an odd number of ECC syndrome bits, allowing a single bit error in the inversion condition bit to be detected and corrected. The single inversion condition bit inverts all memory data bits and all ECC syndrome bits. Two inversion condition bits are added to memory words that have an even number of ECC syndrome bits, so that a single bit error in either inversion condition bit can be detected and corrected. Each of the two inversion condition bits invert around half of the data bits and around half of the ECC syndrome bits.

In one embodiment, ECC is used to correct errors which occur in the memory word. In a further embodiment ECC is used to additionally correct errors which occur with the inversion condition bits, at least one syndrome bit associated with the ECC, and/or a parity bit associated with the ECC.

Figure 6A:
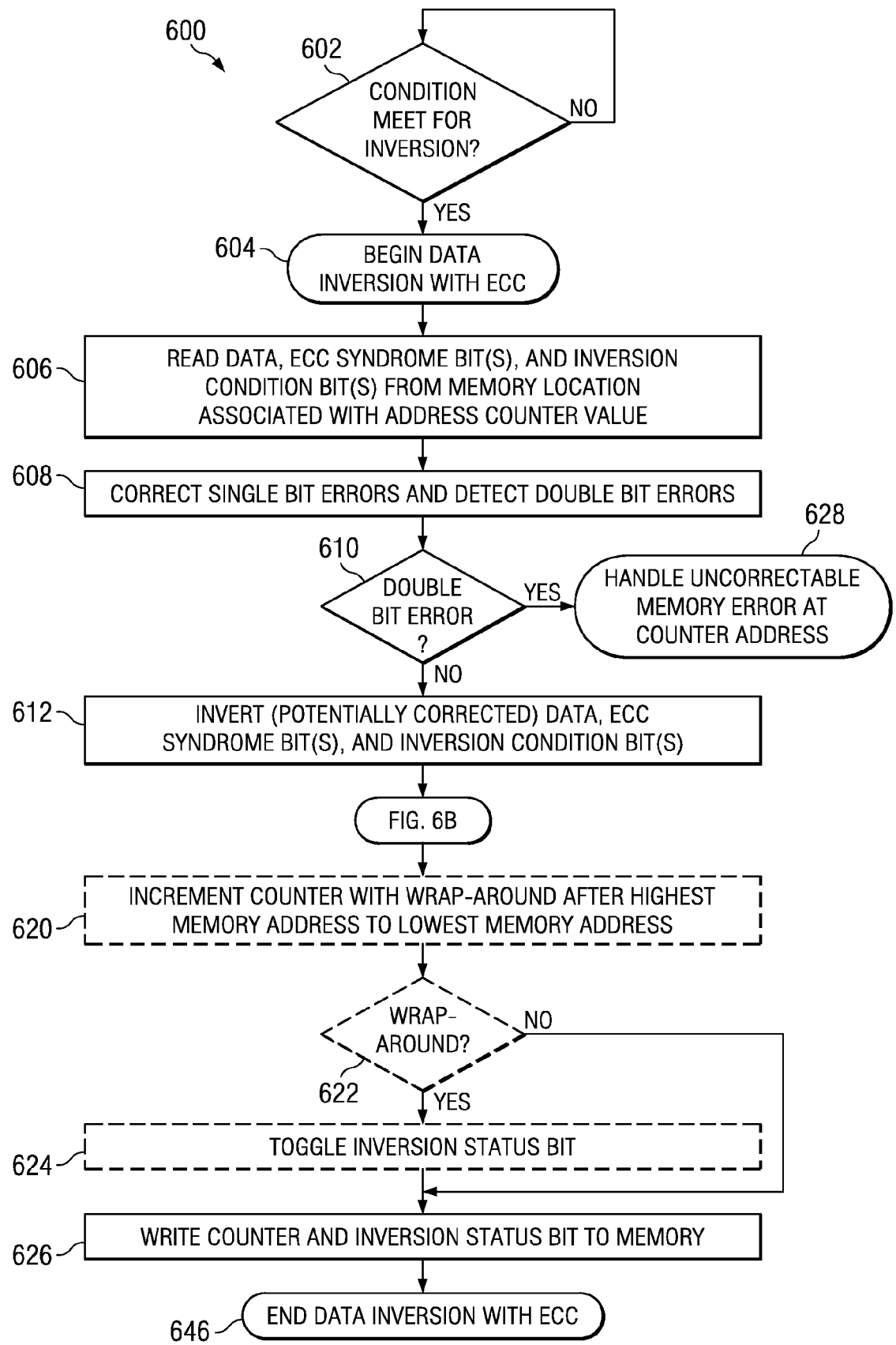
FIG. 6A shows a flow chart for the inversion condition method containing error correcting code (ECC) of selectively inverting a memory word.
Figure 6B:
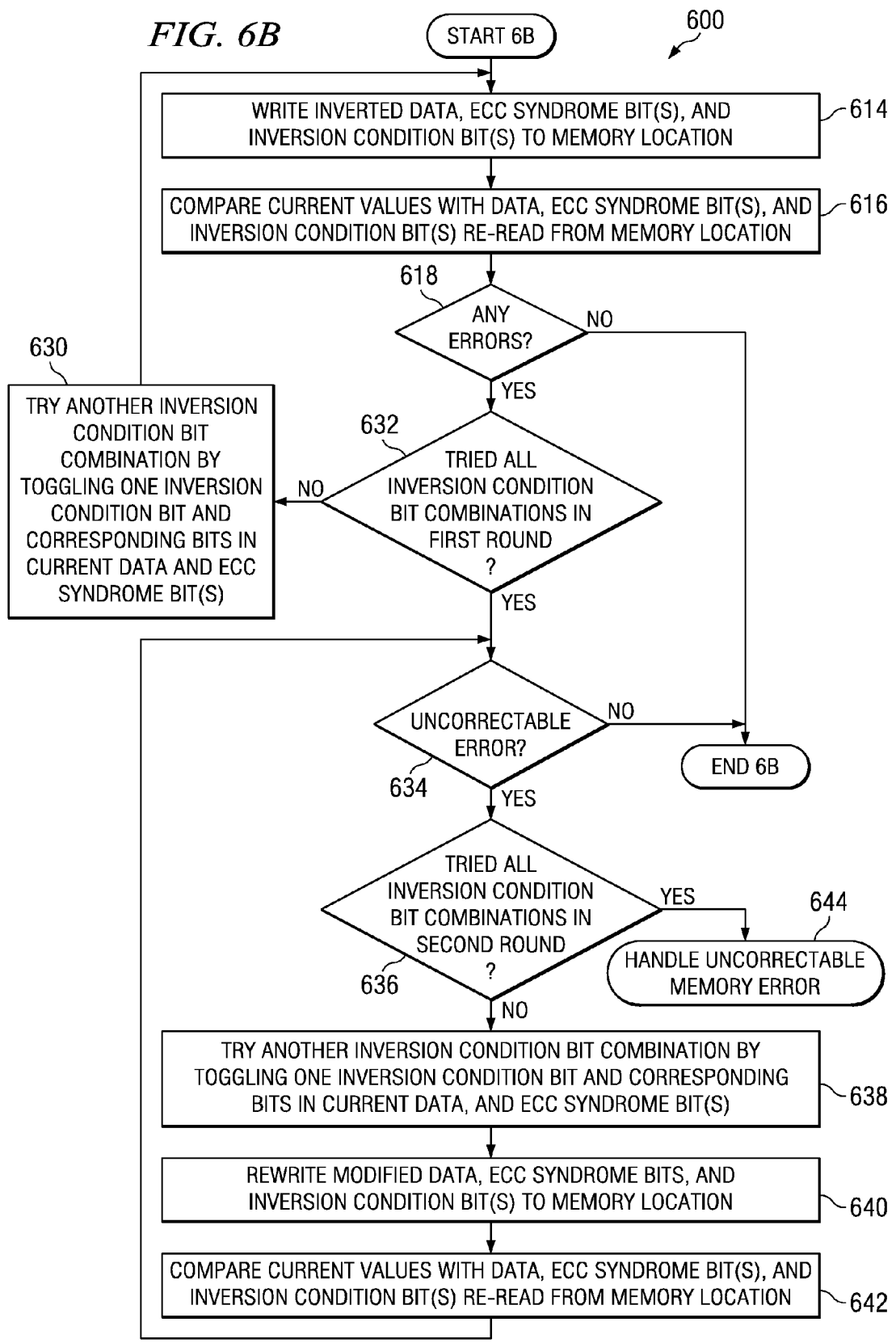
FIG. 6B shows an exemplary flow chart for ECC that is shared between FIGS. 6A, 7, 8, and 9.

FIGS. 6A and 6B shows a method 600 by which the periodic inversion algorithm is used to additionally scrub a memory word for correctable ECC errors before they become uncorrectable double bit errors. After detection and correction of a single bit error data is rewritten to the memory cell with the inversion condition bit toggled. If an ECC error is detected again the correction is retried with the inversion condition bit re-toggled. Failing memory bit(s) are kept at its potentially "stuck at" state. This implementation of the inversion/ECC scrubbing will disable memory access for at least 3 cycles each time a memory word is inverted At 602 (FIG. 6A) a query is made whether the condition for inversion has been met. If the condition for inversion has been met, the inversion with ECC begins at 604. If the condition for inversion has not been met, then the system repeats the query.

At 606 (FIG. 6A) data (a data value), at least one ECC syndrome bit, and an inversion condition bit are read from a memory location associated with an address counter value.

Any single bit errors within the data are corrected and any double bit errors within the data are detected by ECC at 608 (FIG. 6A). The error correction and detection will follow the general ECC structure set forth above.

The address of the uncorrectable double error bit is written to a second additional memory location for future reference at 628 (FIG. 6A). The address counter is configured to no longer use memory addresses containing the double errors since the double bit errors are unable to be corrected using ECC correction code.

At 612 (FIG. 6A) the potentially corrected data, the at least one ECC syndrome bit, and the inversion condition bit(s) are inverted. Inversion of the data may potentially correct the ECC error.

At 614 (FIG. 6B) the inverted data, the inverted at least one ECC syndrome bit(s), and inverted inversion condition bits are re-written to a memory location. In one embodiment the memory location is associated with the address counter address. The re-writing of the memory location will cause the at least one ECC syndrome bit(s) to change accordingly due to their dependence on the data.

At 616 (FIG. 6B), the data, the at least one ECC syndrome bit and the inversion condition bits are re-read from the memory location. The inverted data, the inverted at least one ECC syndrome bit, and the inverted inversion condition bit are then compared to the current values to check for errors caused by toggling.

If an ECC error occurs (618), another inversion condition bit combination is tried at 630 (FIG. 6B). The inversion condition bit is toggled and the corresponding bits in the data and at least one ECC syndrome are also toggled. The process flow then returns to 614 and the toggled data, the toggled at least one ECC syndrome bit(s) and the toggled inversion condition bit are rewritten. The process of acts 614, 616, 618, 632, and 630 (i.e., a first round of error correction) repeats until either the error is repaired or until all inversion condition bit combinations have been attempted.

If all inversion condition bit combinations have been attempted (632, "yes") a second round of error correction is begun. The second round of error correction comprises acts 634, 636, 638, 640, and 642. The second round of error correction repeats until either the error is repaired or until all inversion condition bit combinations have been attempted.

At 638 (FIG. 6B) another inversion condition bit combination is tried by toggling an inversion condition bit and the corresponding bits in the current data and the ECC syndrome.

At 640 (FIG. 6B) the toggled data, the toggled at least one ECC syndrome bit(s) and the toggled inversion condition bit is rewritten to a memory location.

At 642 (FIG. 6B), the data, the at least one ECC syndrome bit(s), and the inversion condition bits are read again from the memory location. The data, the at least one ECC syndrome bit(s) and the inversion condition bit are then compared to the current toggled values to check for errors caused by toggling.

At 644 (FIG. 6B), if an uncorrectable error has occurred (634, "yes") and all inversion condition bit combinations have been tried for the first and second rounds of error correction (636, "yes"), the data address of the uncorrectable error is written to an a second additional memory location and no longer used by the memory address counter.

If no errors are detected, the address counter is optionally incremented at 620 (FIG. 6A). If all of the words of the memory array have been inverted, the address counter optionally wraps around 418 (e.g., returns to the first addressed memory word location) and the inversion status bit will be optionally toggled at 624 (FIG. 6A).

The address counter value and the toggled inversion status bit are then written to memory at 626 (FIG. 6A) and data inversion with ECC is completed at 646 (FIG. 6A).

Figure 7:
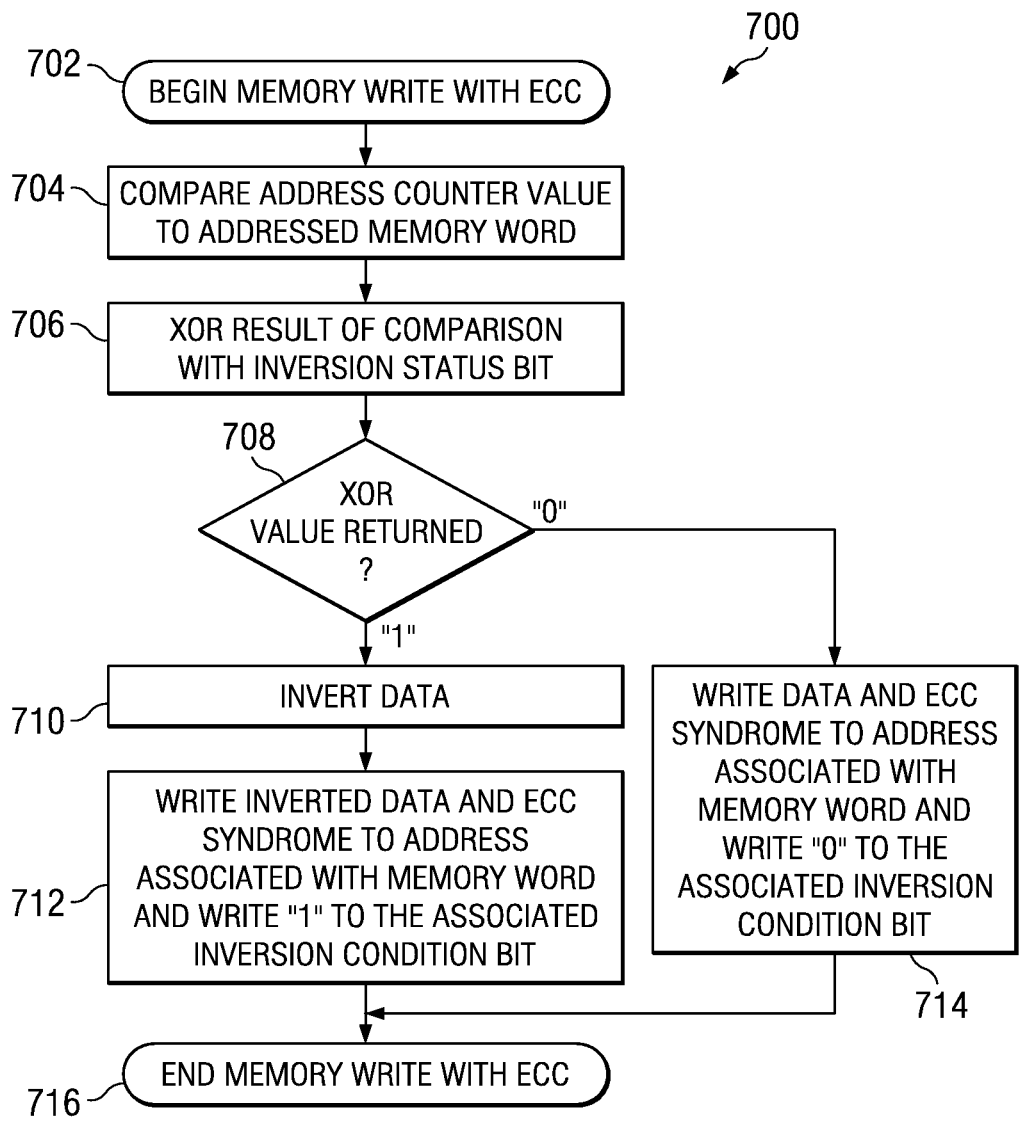
FIG. 7 shows a flow chart for writing a data to memory arrays using ECC and the inversion condition bit method.

Referring to FIG. 7, a method 700 for writing to a memory array using the inversion condition bit method with ECC is shown. At 704 an address counter value is compared to an addressed memory word/location to be written. The comparison will yield a result. For example, if the address is less then the address counter a result of "1" is returned and if the address is greater then the address counter a result of "0" is returned.

The result of the comparison is used in conjunction with the inversion status bit to determine if the data is written in an inverted or non-inverted state at 706. Method 700 shows an XOR function being used for this purpose.

If the result of the XOR is "1" then the data is inverted at 710. The inverted data and an ECC syndrome bit are then written to a memory address associated with the memory word and a high data state (e.g., "1") is written to the associated inversion condition bit to denote inversion of the data. The memory write operation with ECC is concluded at 716.

If the result of the XOR is "0" then the data is not inverted. At 714 the non inverted data and an associated ECC ECC syndrome bit are then written to a memory address associated with the memory word and a low data state (e.g., "0") is written to the associated inversion condition bit to denote that there is not inversion of the data. The memory write operation with ECC is concluded at 716.

Figure 8:
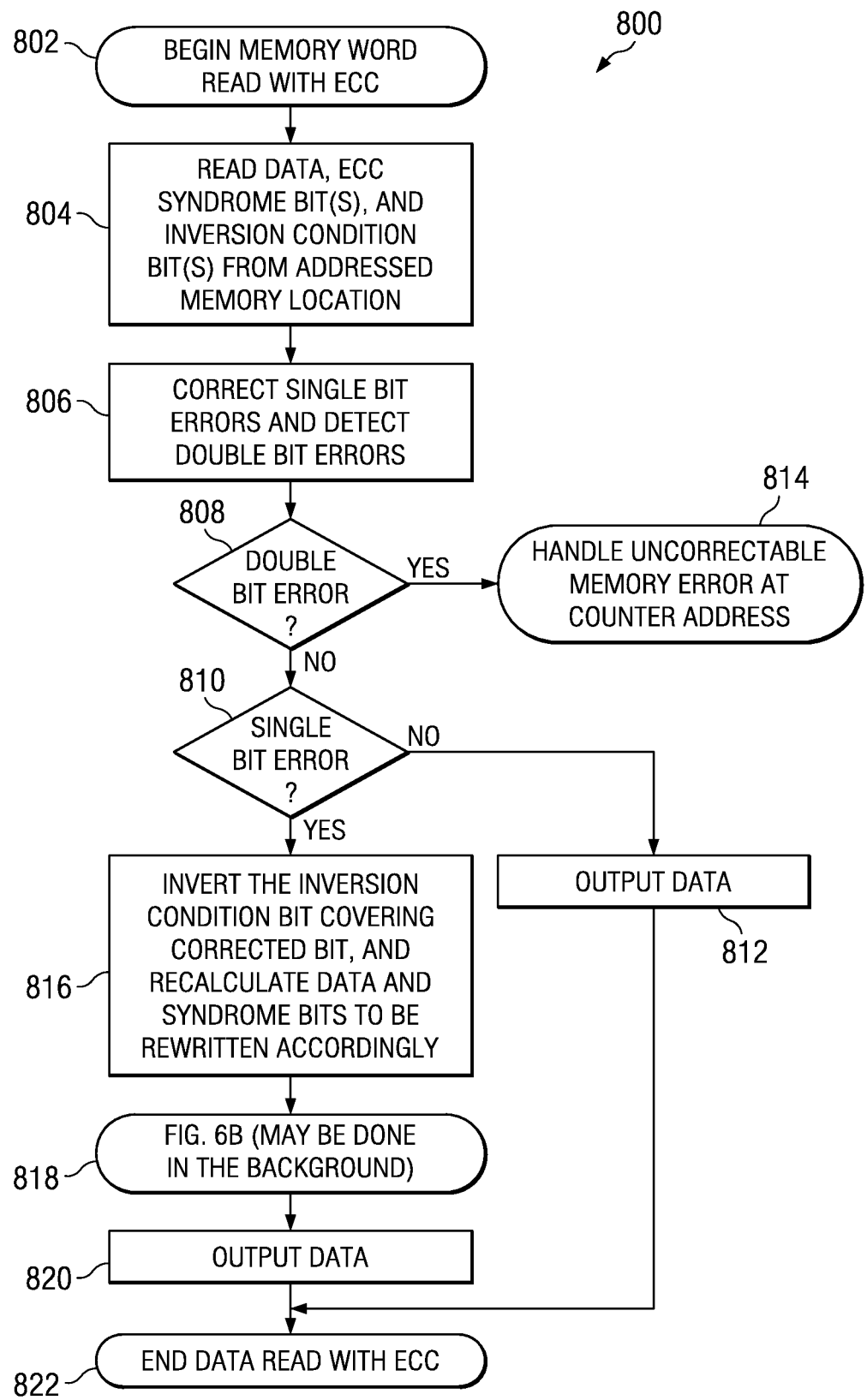
FIG. 8 shows a flow chart for reading a memory word from a memory array using ECC and the inversion condition bit method.

FIG. 8 illustrates a method 800 for reading from a memory array using the inversion condition bit method with ECC.

At 804 data, an ECC syndrome bit, and an inversion condition bit(s) are read from an addressed memory location.

Single bit errors are corrected and double bit errors are detected at 806. The read is checked for errors using standard SECDED methodology and if errors are found which can be corrected, they are corrected. If no single or double bit errors exist, the data is output at 812 and the reading operation is concluded at 822.

At 814 double bit errors are handled at address counter address. Since double bit errors are uncorrectable, an address associated with the uncorrectable double error bit is written to the second additional memory location and is no longer used by the memory address counter.

Single bit errors are corrected by inverting the inversion condition bit covering the corrected bit, and recalculating the data and ECC syndrome bits to be rewritten correspondingly at 816.

Act 818 mirrors that of FIG. 6B to further correct errors through the described first and second rounds of error correction. The acts of FIG. 6B may be performed in the background to minimize impact of system performance. Once act 818 is completed the data is output at 820 and the reading operation is concluded at 822.

Reading memory bits using additional ECC protection is similar to traditional memory array reads. If the inversion condition bit is set such that it implies inversion of the memory data bits the memory data bits will be inverted before being used. For a ferroelectric random access memory array (FRAM), it may be necessary to rewrite FRAM cells which have been read since ferroelectric memory reads of high data states (e.g., "1") are a destructive process.

Figure 9:
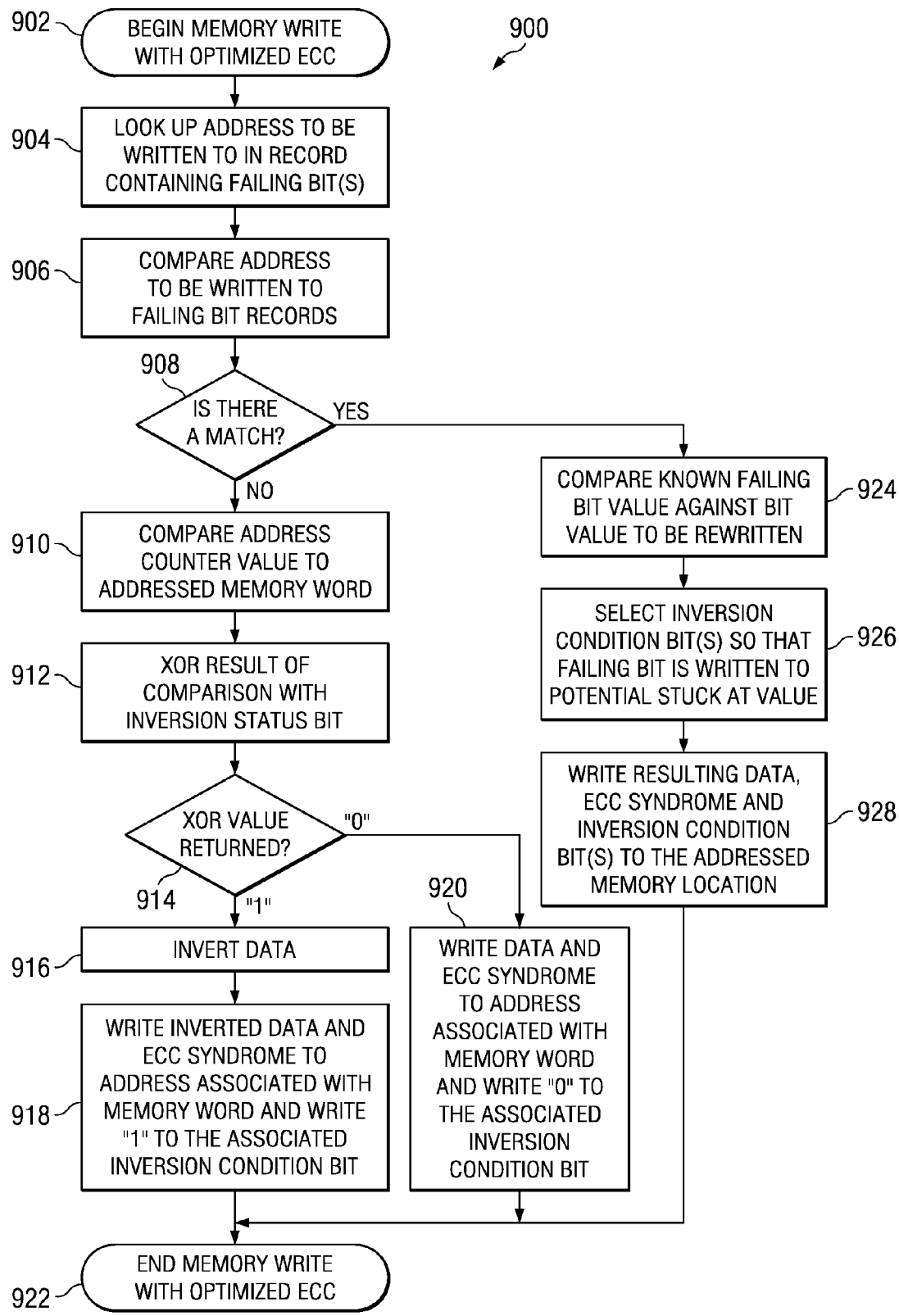
FIG. 9 shows a flow chart for selectively inverting a memory word in a memory array using ECC and the inversion condition bit method.

FIG. 9 illustrates an additional embodiment of the present invention, wherein a method 900 for writing to a memory array in which double error correction is optimized. In this method 900, a third additional memory location is used to store a record of failing bits. The third additional memory location may be part of a content addressable memory (CAM). The CAM would subsequently be backed up to another memory location. In alternative embodiments other forms of memory which offer greater error correction capabilities at a higher cost (e.g., larger area) can be used in place of a CAM. The record of the failing bits comprises the memory word address of the error, the failing bit position (can include syndrome and inversion condition bits), and the value of the failing bit.

At 904 the address to be written to is looked up in a record comprising the failing bits. The record of the failing bits may be kept in a content addressable memory (CAM), for example. The use of a CAM allows quick access time and minimizes performance impact. The address to be written to failing bit records are compared to the address looked up in the failing bit record at 906. A match of the address counter value and failing record bit indicates that the address counter value is at a failing bit value.

If there is no match between the address counter value and the failing bit record then data is written in a manner that mirrors that of FIG. 7. Acts 910 through 920 are described in FIG. 7. The memory write operation is concluded at 922.

If there is a match between the address counter value and the failing bit record then the known failing bit value is compared against the bit value to be written at 924.

At 926 the inversion condition bit is then changed so that the known failing bit is written to its potentially "stuck at" value, wherein the stuck at value is the value of a data state that has been imprinted to the memory cell (e.g., the value that is likely to be returned from the memory cell during a read regardless of the value stored in the memory cell).

The resulting data, ECC syndrome bit, and inversion condition bit(s) are then written to the addressed memory location at 928 and the memory write operation is concluded at 922.

The inversion methods of this disclosure invert the memory array in discrete atomic units. By inverting a small granularity of the memory array at any given time the memory array can continue to function with only a very small fraction of the cycles of each memory location needing to be used for the refresh/invert operations. This is in contrast to prior art, where by memory arrays were inverted as a single block making the memory unavailable for long periods of time. In the methods disclosed, for all but the worst case, where memory is accessed during every cycle of its lifetime, the performance penalty on the memory array is negligible. For the worst case, white cycles would need to be used so that memory inversion could take place. The performance degradation of such cycles would still be minimal compared to prior art.

Further, usually memory inversion accesses can be implemented in otherwise idle memory cycles to make the inversion completely transparent to the system. Depending on the size and speed of the memory, there may be billions of cycles between each time the memory inversion algorithm needs to perform a memory access making access during idle memory cells completely transparent to the system.

Moreover, there are many different conditions by which inversion can take place. For example, inversion can be performed on every memory cell at a given time increment. Alternatively, inversion can be performed on individual memory cells that have remained in the same state for a given time period, to memory cells being written, or to memory cells being read. The inventors have contemplated many different ways in which the inversion can be done through the control circuitry.

In an additional embodiment, to increase reliability of the memory, updating the inversion condition bit and the memory word bits are done in separate write acts.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method, comprising:
    storing a data value in a memory word comprising one or more memory cells;
    storing an inversion condition bit in a memory location operably associated with the memory word, wherein the inversion condition bit indicates if the associated memory word currently stores an actual data value or an inverted data value;
    providing an inversion status bit that comprises information associated with an inversion status of the memory array;
    providing an address counter value from an address counter configured to advance through a plurality of address counter values, so that each memory word in the memory array is associated with a particular address counter value;
    reading the data value and the inversion condition bit from the memory location associated with the address counter value;
    inverting the data value
    inverting the inversion condition bit;
    re-writing the inverted data value and the inverted inversion condition bit to the memory location associated with the address counter value;
    incrementing the address counter value; and
    toggling the inversion status bit and resetting the address counter to the lowest numbered memory address once the memory address counter has addressed the plurality of memory addresses;
    providing a control circuitry by which an error correction code (an ECC) can be implemented;
    storing at least one ECC syndrome bit and a parity bit in a first additional memory location; and
    a read operation of the method comprising:
        reading the data value, the inversion condition bit, and the at least one ECC syndrome bit;
        correcting single bit errors and detecting double bit errors using ECC;
        storing an address associated with an uncorrectable double error bit in a second additional memory location;
        performing a first round of error correction if an error is detected, the first round of error correction comprising selectively inverting the data value, the inversion condition bit, and the at least one ECC syndrome bit until a single bit error is corrected or all inversion condition bit combinations are exhausted;
        performing a second round of error correction if the error is still detected, wherein the second round of error correction comprises selectively inverting the data value, the inversion condition bit, and the at least one ECC syndrome bit until a single bit error is corrected or all inversion condition bit combinations are exhausted;
        storing an address associated with an uncorrectable double error bit in the second additional memory location;
        incrementing the memory address counter;
        toggling the inversion status bit once the memory address counter has addressed the plurality of memory addresses; and
        writing an memory address counter value and the toggled inversion status bit to memory.

2. The method of claim 1, further comprising:
    comparing the address counter value with an address of a memory location to be written;

operating a logic function on a result of the comparison and the inversion status bit to determine if inversion of data to be written is needed; and inverting the data to be written data and writing the inverted data and an inversion condition bit indicating that the memory word is inverted to the addressed memory location; or writing the data to be written and an inversion condition bit indicating the memory word is not inverted to the addressed memory location.

3. The method of claim 1, further comprising:

reading a data value and a corresponding inversion condition bit from the addressed memory location; and outputting either the data value or the inverted data value, depending on the value of the inversion condition bit.

4. The method of claim 1, further comprising:

comparing an address of the memory word with the memory word address from the memory address counter;

operating a logic function on a result of the comparison and the inversion status bit, resulting in an output data value, an output inversion condition bit, and an output at least one ECC syndrome bit;

performing a first round of error correction if an error is found, the first round of error correction comprising selectively inverting the data value, the inversion condition bit, and the at least one ECC syndrome bit until a single bit error is corrected or all inversion condition bit combinations are exhausted;

performing a second round of error correction if the error is still found, wherein the second round of error correction comprises selectively inverting the data value, the inversion condition bit, and the at least one ECC syndrome bit until a single bit error is corrected or all inversion condition bit combinations are exhausted; and storing an address associated with an uncorrectable double error bit in a second additional memory location.

5. The method of claim 1, further comprising storing a record of a failing bit of the ECC in a third additional memory location, wherein the record of failing bits comprises a memory word address of the memory bit, a position of the failing bit, and a value of the failing bit.

6. The method of claim 5, further comprising:

comparing the memory word address to the record of failing bits; and performing the method of claim 4, if there is no match between addresses; or writing the inversion condition bit so that the failing bit is written to its potential stuck at value, if there is a match.

7. A method comprising:

storing a data value in one or more memory cells, the one or more memory cells comprising a memory word;

storing an inversion status bit in a memory location operably associated with the memory word, wherein the inversion status bit indicates if the memory word has been inverted;

providing an inversion pending bit in indicative of whether inversion of the memory word has taken place;

providing an address counter value from an address counter configured to advance through a plurality of address counter values, so that each memory word in the memory array is associated with a particular address counter value;

reading the data value;

setting the inversion pending bit to a data state indicating inversion of the data value is in progress;

writing the inversion status bit, the memory word address, the inversion pending bit, and at least one bit of the data value as one word a fourth additional memory location;

inverting the data value;

re-writing the inverted data value to the one or more memory cells;

setting the inversion pending bit to a data state indicating inversion of the data value is not in progress;

incrementing the address counter value;

toggling the inversion status once the address counter has addressed the plurality of memory addresses; and writing the inversion status bit, the memory word address, and the inversion pending bit as one word to the fourth additional memory location.

8. The method of claim 7, further comprising:

comparing the address counter value with the memory word address;

operating a logic function on a result of the comparison and the inversion status bit to determine if inversion of a data value to be written is needed; and inverting the data value to be written data and writing the inverted data value to the memory word address; or writing the data to be written to the memory word address.

9. The method of claim 7, further comprising:

reading the data value and the inversion condition bit;

comparing the address counter value with the memory word address;

operating a logic function on a result of the comparison and the inversion status bit to determine if inversion of a data value to be written is needed; and inverting the data value to be written and outputting the inverted data value; or outputting the inverted data value.

\* \* \* \* \*